(12) United States Patent
Matsuoka et al.

(10) Patent No.: US 11,216,123 B2
(45) Date of Patent: Jan. 4, 2022

(54) CONDUCTIVE FILM, TOUCH PANEL SENSOR, AND TOUCH PANEL

(71) Applicant: FUJIFILM Corporation, Tokyo (JP)

(72) Inventors: Chika Matsuoka, Kanagawa (JP); Takahiko Ichiki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/015,783

(22) Filed: Sep. 9, 2020

(65) Prior Publication Data

US 2020/0409494 A1 Dec. 31, 2020

Related U.S. Application Data

(63) Continuation of application No. PCT/JP2019/009740, filed on Mar. 11, 2019.

(30) Foreign Application Priority Data

Mar. 26, 2018 (JP) .............................. JP2018-058757

(51) Int. Cl.
 *G06F 3/044* (2006.01)
 *H05K 1/09* (2006.01)
 (Continued)

(52) U.S. Cl.
 CPC ............... *G06F 3/044* (2013.01); *B32B 15/04* (2013.01); *H01B 5/14* (2013.01); *H05K 1/09* (2013.01); *G06F 2203/04112* (2013.01)

(58) Field of Classification Search
 CPC ........... G06F 3/044; G06F 2203/04112; B32B 15/04; H01B 5/14; H05K 1/09
 See application file for complete search history.

(56) References Cited

U.S. PATENT DOCUMENTS

2009/0269599 A1 10/2009 Tsurumi
2014/0197539 A1* 7/2014 Bayerer ................. H01L 24/03
257/762
(Continued)

FOREIGN PATENT DOCUMENTS

JP 2000-259095 A 9/2000
JP 2006-135271 A 5/2006
(Continued)

OTHER PUBLICATIONS

International Search Report issued in PCT/JP2019/009740; dated May 21, 2019.
(Continued)

*Primary Examiner* — Lixi C Simpson
(74) *Attorney, Agent, or Firm* — Studebaker & Brackett PC (57) ABSTRACT

The present invention provides a conductive film in which a change in the surface state is suppressed and the light-fast adhesiveness of a protective layer is excellent, a touch panel sensor, and a touch panel. The conductive film according to the present invention includes a substrate, a patterned layer to be plated which is arranged on at least one surface of the substrate and has a functional group interacting with a plating catalyst or a precursor thereof, a copper plating layer which is arranged to cover the patterned layer to be plated and is in contact with the substrate, a metal layer which is arranged to cover the copper plating layer and contains a metal that is electrochemically nobler than copper, a nitrogen-containing compound layer which is arranged to cover the metal layer that is electrochemically nobler than copper, and a protective layer which is arranged to cover the nitrogen-containing compound layer.

20 Claims, 2 Drawing Sheets

(51) Int. Cl.
    *H01B 5/14*      (2006.01)
    *B32B 15/04*     (2006.01)

(56)            References Cited

U.S. PATENT DOCUMENTS

2015/0093587 A1*  4/2015  Imamura ............. H05K 1/0274
                                                        428/457
2015/0195908 A1   7/2015  Matsushita et al.
2018/0046284 A1*  2/2018  Higashi .............. C23C 18/1605
2018/0371619 A1* 12/2018  Tsukamoto ............ B32B 27/40

FOREIGN PATENT DOCUMENTS

JP      2009-280905 A    12/2009
JP      2014-078681 A     5/2014
JP      2016-221843 A    12/2016
JP      2016-224631 A    12/2016

OTHER PUBLICATIONS

International Preliminary Report on Patentability and Written Opinion issued in PCT/JP2019/009740; dated Sep. 29, 2020.

* cited by examiner

CONDUCTIVE FILM, TOUCH PANEL SENSOR, AND TOUCH PANEL

CROSS-REFERENCE TO RELATED APPLICATIONS

This application is a Continuation of PCT International Application No. PCT/JP2019/009740 filed on Mar. 11, 2019, which claims priority under 35 U.S.C. § 119(a) to Japanese Patent Application No. 2018-058757 filed on Mar. 26, 2018. The above application is hereby expressly incorporated by reference, in its entirety, into the present application.

BACKGROUND OF THE INVENTION

1. Field of the Invention

The present invention relates to a conductive film, a touch panel sensor, and a touch panel.

2. Description of the Related Art

A conductive film (a substrate with a metal layer) in which a metal layer (preferably a patterned metal layer) is arranged on a substrate is used for various applications. For example, in recent years, the mounting rate of touch panels on mobile phones, portable game devices, and the like has been increasing, leading to a rapid increase in demand for conductive films for capacitance type touch panel sensors capable of performing multipoint detection.

For example, JP2006-135271A discloses a method of obtaining a conductive film by forming a polymer layer (a layer to be plated) containing a functional group that interacts with a plating catalyst or a precursor thereof on a substrate, and then performing a plating treatment to form a patterned metal layer.

SUMMARY OF THE INVENTION

The present inventors have produced a conductive film including a copper plating layer according to the method described in JP2006-135271A and evaluated the properties thereof. As a result, it has been found that the surface state of the conductive film is deteriorated with the passage of time in some cases. Particularly, in a case where a polycarbonate substrate (a substrate containing a polycarbonate-based resin) is used as a substrate, the dissolution of the substrate in the conductive film is observed in some cases.

In addition, there is a case where a protective layer may be provided to protect a copper plating layer in the conductive film. However, in a case where the protective layer is arranged so as to cover the copper plating layer prepared according to the method described in JP2006-135271A, the adhesiveness of the protective layer (hereinafter, also referred to as "light-fast adhesiveness of the protective layer") in a case of performing light irradiation on the conductive film for a long period of time is not sufficient and further improvement is required.

In view of the above situation, an object of the present invention to provide a conductive film in which a change in the surface state is suppressed and the light-fast adhesiveness of a protective layer is excellent.

In addition, another object of the present invention is to a touch panel sensor and a touch panel.

As a result of intensive investigations on the above objects, the present inventor has found that the above objects can be achieved by using a conductive film having a predetermined layer structure.

That is, the present inventor has found that the above objects can be solved by the following configurations.

(1) A conductive film comprising:
a substrate;
a patterned layer to be plated which is arranged on at least one surface of the substrate and has a functional group interacting with a plating catalyst or a precursor thereof;
a copper plating layer which is arranged to cover the patterned layer to be plated and is in contact with the substrate;
a metal layer which is arranged to cover the copper plating layer and contains a metal that is electrochemically nobler than copper;
a nitrogen-containing compound layer which is arranged to cover the metal layer containing the metal that is electrochemically nobler than copper; and
a protective layer which is arranged to cover the nitrogen-containing compound layer.

(2) The conductive film according to (1), in which the nitrogen-containing compound layer contains a nitrogen-containing non-aromatic compound or a nitrogen-containing aromatic compound.

(3) The conductive film according to (2), in which the nitrogen-containing compound layer contains the nitrogen-containing non-aromatic compound.

(4) The conductive film according to (3), in which the nitrogen-containing non-aromatic compound is a nitrogen-containing aliphatic acyclic compound.

(5) The conductive film according to (4), in which the nitrogen-containing aliphatic acyclic compound is a compound represented by Formula (1) shown below.

(6) The conductive film according to any one of (1) to (5), in which the protective layer contains at least one hetero atom selected from the group consisting of a silicon atom, a sulfur atom, and a phosphorus atom.

(7) The conductive film according to any one of (1) to (6), in which the protective layer contains a siloxane-based resin.

(8) The conductive film according to any one of (1) to (7), in which the patterned layer to be plated is arranged in a mesh shape.

(9) The conductive film according to any one of (1) to (8), in which the substrate has a three-dimensional shape.

(10) A touch panel sensor comprising: the conductive film according to any one of (1) to (9).

(11) A touch panel comprising: the touch panel sensor according to (10).

According to the present invention, it is possible to provide a conductive film in which a change in the surface state is suppressed and the light-fast adhesiveness of a protective layer is excellent.

In addition, according to the present invention, it is possible to provide a touch panel sensor and a touch panel.

DESCRIPTION OF THE PREFERRED EMBODIMENTS

The present invention will be described in detail below.

In the present specification, a numerical range expressed using "to" means a range including numerical values before and after "to" as a lower limit value and an upper limit value. In addition, the drawings in the present invention are schematic views for facilitating the understanding of the present invention, and the thickness relationship or the positional relationship of each layer is not limited to the embodiment of the drawings.

The feature of the conductive film according to the embodiment of the present invention is that a metal layer containing a metal that is electrochemically nobler than copper (hereinafter, also simply referred to as "specific metal layer"), and a nitrogen-containing compound layer are arranged between a copper plating layer and a protective layer.

The present inventors have conducted investigations on a mechanism of causing a change in the surface state of a conductive film in the related art and thus have found that copper ions generated by the contact of the copper plating layer with moisture or oxygen penetrate into the substrate and catalytically decompose the substrate. Particularly, the above phenomenon is likely to occur at the contact portion between the substrate and the copper plating layer arranged so as to cover the layer to be plated.

Therefore, the present inventors have found that by arranging a specific metal layer and a nitrogen-containing compound layer between the copper plating layer and the protective layer, the ionization of copper is prevented so that the progress of decomposition of the substrate can be suppressed and the adhesiveness with the protective layer is improved.

Figure 1:
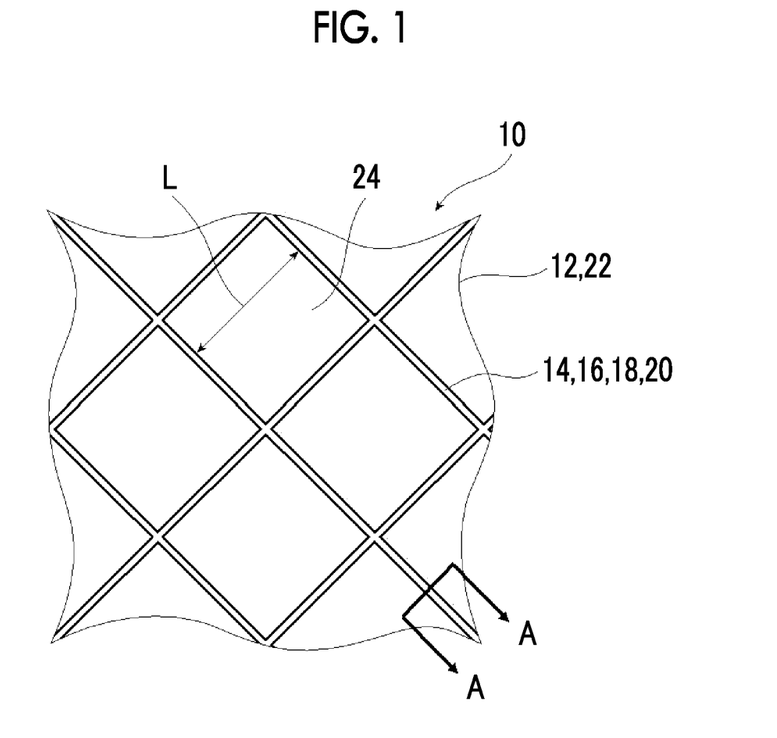
FIG. 1 is an enlarged top view of an embodiment of a conductive film.

The embodiments of the conductive film according to the present invention will be described below. FIG. 1 is an enlarged top view of one embodiment of a conductive film according to the present invention, and FIG. 2 is a cross-sectional view taken along line A-A of the conductive film shown in FIG. 1.

A conductive film 10 includes a substrate 12, a patterned layer to be plated 14 which is arranged on one surface of the substrate 12, a copper plating layer 16 which is arranged to cover the patterned layer to be plated 14 and is in contact with the substrate 12, a specific metal layer 18 which is arranged so as to cover the copper plating layer 16, a nitrogen-containing compound layer 20 which is arranged so as to cover the specific metal layer 18, and a protective layer 22 which is arranged so as to cover the nitrogen-containing compound layer 20.

Figure 2:
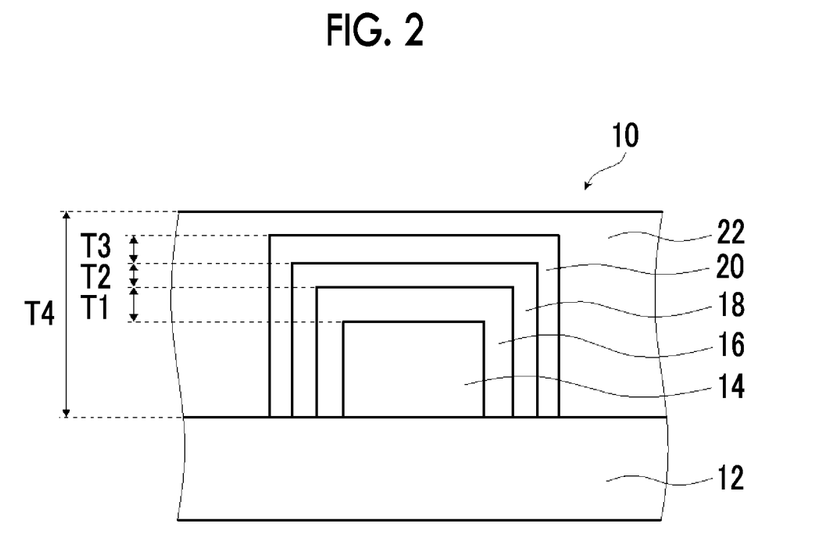
FIG. 2 is a cross-sectional view taken along line A-A of the conductive film shown in FIG. 1.

As shown in FIGS. 1 and 2, the patterned layer to be plated 14 is arranged in a mesh shape, and the copper plating layer 16 is arranged along the shape. That is, the copper plating layer 16 is also arranged in a mesh shape.

Hereinafter, each member constituting the conductive film will be described in detail.

<Substrate>

The substrate may be a member having two main surfaces and supporting each member.

Examples of the substrate include known substrates (for example, a resin substrate, a glass substrate, and a ceramic substrate), a flexible substrate (preferably an insulating substrate) is preferable, and a resin substrate is more preferable.

Examples of materials for the resin substrate include a polycarbonate-based resin, a polyacrylic resin, a polyether sulfone-based resin, a polyurethane-based resin, a polyester-based resin, a polysulfone-based resin, a polyamide-based resin, a polyarylate-based resin, a polyolefin-based resin, a cellulose-based resin, a polyvinyl chloride-based resin, and a cycloolefin-based resin.

The thickness of the substrate is not particularly limited, and is preferably 0.05 to 2 mm and more preferably 0.1 to 1 mm from the viewpoint of a balance in handling and thickness reduction.

As the substrate, a transparent substrate (particularly a transparent resin substrate) is preferable. The transparent substrate means a substrate having a transmittance of 60% or more for visible light (at a wavelength of 400 to 700 nm), and the transmittance is preferably 80% or more and more preferably 90% or more.

In addition, the substrate may have a multilayer structure, and may be constituted of, for example, a support and a primer layer arranged on the support. Since the substrate includes the primer layer, the adhesiveness of the patterned layer to be plated is further improved.

Examples of the support include known supports (for example, a resin support, a glass support, and a ceramic support). Examples of materials for the resin support include the resins exemplified above as the materials for the resin substrate.

A well-known primer layer may be used as a primer layer.

Although the substrate has a flat plate shape in FIGS. 1 and 2, the shape of the substrate is not particularly limited, and for example, the substrate may have a three-dimensional shape. Examples of the three-dimensional shape include shapes including a curved surface.

<Patterned Layer to be Plated>

The patterned layer to be plated is a layer having a functional group (hereinafter, also referred to as "interactive group") that interacts with a plating catalyst or a precursor thereof, and is a layer arranged in a predetermined pattern. As described above, in the conductive film 10 shown in FIGS. 1 and 2, the patterned layer to be plated 14 is arranged in a mesh shape.

The copper plating layer described later is arranged along the pattern shape of the patterned layer to be plated. Therefore, a patterned copper plating layer having a desired shape is formed by arranging the patterned layer to be plated on the substrate according to the shape of the copper plating layer to be formed.

In FIGS. 1 and 2, the patterned layer to be plated is arranged in a mesh shape, but the present invention is not limited to this embodiment. The patterned layer to be plated may have another pattern shape (for example, a stripe shape).

The thickness of the patterned layer to be plated is not particularly limited, and is preferably 0.05 to 2.0 μm and more preferably 0.1 to 1.0 μm from the viewpoint of being able to sufficiently carry a plating catalyst or a precursor thereof and preventing abnormal plating.

In a case where the patterned layer to be plated has a mesh shape, the line width of the thin line portion forming the mesh is not particularly limited. From the viewpoint of a balance between the conductive properties of the copper plating layer and the difficulty in visual recognition, the line width is preferably 30 μm or less, more preferably 15 μm or less, even more preferably 10 μm or less, and particularly preferably 5 μm or less, and is preferably 0.5 μm or more and more preferably 1 μm or more.

In a case where the patterned layer to be plated has a mesh shape, it is preferable that the opening portions (opening portions 24 in FIG. 1) of the mesh have a substantially rhombic shape. However, additionally, a polygonal shape (for example, a triangle, a quadrangle, a hexagon, and a random polygon) may be adopted. In addition, the shape of one side may be a curved shape or an arc shape other than the straight shape. In a case of an arc shape, for example, two facing sides may be formed to have an outwardly convex arc shape and the other two facing sides may be formed to have an inwardly convex arc shape. In addition, the shape of each side may be a wavy shape in which an outwardly convex arc shape and an inwardly convex arc shape are continuously formed. Of course, the shape of each side may be a sine curve.

The length L of one side of the opening portion is not particularly limited, preferably 1500 µm or less, more preferably 1300 µm or less, even more preferably 1000 µm or less, and is preferably 5 µm or more, more preferably 30 µm or more, and still even preferably 80 µm or more. In a case where the length of the side of the opening portion is in the above range, it is possible to further maintain good transparency, and in a case where the conductive film is attached to the front surface of a display device, it is possible to visually recognize the display without an uncomfortable feeling.

From the viewpoint of transmittance, the area of the region in which the patterned layer to be plated is formed is preferably 50% by area or less, more preferably 40% by area or less, and even more preferably 30% by area or less with respect to the total surface area of the substrate. The lower limit value is not particularly limited, but is often 0.5% by area or more.

The interactive group of the patterned layer to be plated means a functional group capable of interacting with a plating catalyst or a precursor thereof that is applied to the patterned layer to be plated, and examples thereof include a functional group capable of forming an electrostatic interaction with a plating catalyst or a precursor thereof, and a nitrogen-containing functional group, a sulfur-containing functional group, and an oxygen-containing functional group capable of forming a coordination with a plating catalyst or a precursor thereof.

Examples of the interactive group include nitrogen-containing functional groups such as an amino group, an amide group, an imide group, a urea group, a tertiary amino group, an ammonium group, an amidino group, a triazine ring, a triazole ring, a benzotriazole group, an imidazole group, a benzimidazole group, a quinoline group, a pyridine group, a pyrimidine group, a pyrazine group, a quinazoline group, a quinoxaline group, a purine group, a piperidine group, a piperazine group, a pyrrolidine group, a pyrazole group, an aniline group, a group containing an alkylamine structure, a group containing an isocyanuric structure, a nitro group, a nitroso group, an azo group, a diazo group, an azido group, a cyano group, and a cyanate group; oxygen-containing functional groups such as an ether group, a hydroxyl group, a phenolic hydroxyl group, a carboxylic acid group, a carbonate group, a carbonyl group, an ester group, a group containing an N-oxide structure, a group containing an S-oxide structure, and a group containing an N-hydroxy structure; sulfur-containing functional groups such as a thiophene group, a thiol group, a thiourea group, a thiocyanuric acid group, a benzthiazole group, a mercaptotriazine group, a thioether group, a thioxy group, a sulfoxide group, a sulfone group, a sulfite group, a group containing a sulfoximine structure, a group containing a sulfoxonium salt structure, a sulfonic acid group, and a group containing a sulfonic acid ester structure; phosphorus-containing functional groups such as a phosphate group, a phosphoramide group, a phosphine group, and a group containing a phosphoric acid ester structure; and groups containing halogen atoms such as a chlorine atom and a bromine atom, and in a functional group that may have a salt structure, a salt thereof may also be used.

Among them, an ionic polar group such as a carboxylic acid group, a sulfonic acid group, a phosphoric acid group, or a boronic acid group, or a cyano group is preferable and a carboxylic acid group or a cyano group is more preferable from the viewpoint of high polarity and high adsorption ability to a plating catalyst or a precursor thereof.

The patterned layer to be plated usually contains a compound having the above-mentioned interactive group. The compound is preferably a polymer. That is, the patterned layer to be plated preferably includes a polymer containing a repeating unit having an interactive group. The polymer containing a repeating unit having an interactive group will be described in detail later.

In a case where the patterned layer to be plated includes a polymer containing a repeating unit having an interactive group, the content of the polymer is preferably 30% by mass or more and more preferably 50% by mass or more with respect to the total mass of the patterned layer to be plated. The upper limit value is not particularly limited and may be 100% by mass.

<Copper Plating Layer>

The copper plating layer is a layer arranged so as to cover the patterned layer to be plated.

As described above, the copper plating layer is arranged along the pattern shape of the patterned layer to be plated. For example, in a case where the patterned layer to be plated has a mesh shape, the copper plating layer to be formed also has a mesh shape.

In addition, the copper plating layer is arranged so as to be in contact with the substrate 12. For example, as shown in FIG. 2, the copper plating layer 16 is arranged so as to cover the patterned layer to be plated 14 and a part thereof is in contact with the substrate 12.

The copper plating layer is a layer mainly formed of copper. The main component means that the content of copper (metal copper) is 90% by mass or more with respect to the total mass of the copper plating layer. In this content range, the content of copper in the copper plating layer is preferably 95% by mass or more, and more preferably 100% by mass with respect to the total mass of the copper plating layer.

In a case where the copper plating layer has a mesh shape, the line width of the thin line portion constituting the mesh is not particularly limited. From the viewpoint of a balance between the conductive properties and the difficulty of visual recognition of the copper plating layer, the line width is preferably 30 µm or less, more preferably 15 µm or less, even more preferably 10 µm or less, and particularly preferably 5 µm or less, and is preferably 0.5 µm or more and more preferably 1 µm or more.

The thickness of the copper plating layer is not particularly limited, and is preferably 0.1 to 5.0 µm and more preferably 0.3 to 3.0 µm from the viewpoint of lower resistance and more excellent adhesiveness.

The thickness of the copper plating layer corresponds to a thickness T1 from the surface of the copper plating layer 16 on the patterned layer to be plated 14 side along the normal direction of the surface of the substrate 12 to the surface opposite to the patterned layer to be plated 14 side as shown in FIG. 2.

<Metal Layer Containing Metal Electrochemically Nobler than Copper>

The metal layer containing a metal electrochemically nobler than copper is a layer arranged so as to cover the copper plating layer.

The specific metal layer contains a metal that is electrochemically nobler than copper. Examples of the metal electrochemically nobler than copper include palladium, silver, gold, mercury, and platinum, and palladium is preferable from the viewpoint that a change in the surface state of the conductive film is further suppressed.

The specific metal layer preferably contains, as a main component, a metal that is electrochemically nobler than copper. The main component means a component having the largest content (mass) among the components included in the specific metal layer. The content of the metal that is electrochemically nobler than copper in the specific metal layer is preferably 55% by mass or more, more preferably 70% by mass or more, and even more preferably 100% by mass with respect to the total mass of the specific metal layer.

The thickness of the specific metal layer is not particularly limited, and is preferably 100 nm or less and more preferably 70 nm or less from the viewpoint of not reducing the conductivity of the copper plating layer. The lower limit is not particularly limited, but is preferably 10 nm or more.

The thickness of the specific metal layer corresponds to a thickness T2 from the surface of the specific metal layer 18 on the copper plating layer 16 side along the normal direction of the surface of the substrate 12 to the surface opposite to the copper plating layer 16 side as shown in FIG. 2.

<Nitrogen-Containing Compound Layer>

The nitrogen-containing compound layer is a layer arranged so as to cover the specific metal layer. By arranging the nitrogen-containing compound layer between the copper plating layer and the protective layer, the light-fast adhesiveness of the protective layer is improved.

The nitrogen-containing compound layer is a layer containing a nitrogen-containing compound as a main component. The main component means that the content of the nitrogen-containing compound is 90% by mass or more with respect to the total mass of the nitrogen-containing compound layer, and the content is preferably 100% by mass.

The nitrogen-containing compound means a compound containing a nitrogen atom. The nitrogen-containing compound may contain hetero atoms such as an oxygen atom, a sulfur atom, a phosphorus atom, and a silicon atom, in addition to the nitrogen atom, and preferably contains an oxygen atom from the viewpoint that the light-fast adhesiveness of the protective layer is more excellent.

Examples of the nitrogen-containing compound include a nitrogen-containing non-aromatic compound and a nitrogen-containing aromatic compound, and a nitrogen-containing non-aromatic compound is preferable from the viewpoint that the light-fast adhesiveness of the protective layer is more excellent.

The nitrogen-containing non-aromatic compound means a non-aromatic compound containing a nitrogen atom.

Examples of the nitrogen-containing non-aromatic compound include a nitrogen-containing aliphatic acyclic compound, and a nitrogen-containing aliphatic cyclic compound, and from the viewpoint that the light-fast adhesiveness of the protective layer is more excellent, a nitrogen-containing aliphatic acyclic compound is preferable.

The nitrogen-containing aliphatic acyclic compound means an acyclic (for example, linear or branched) aliphatic compound containing a nitrogen atom, and examples thereof include triethanolamine, diethanolamine, and monoethanolamine.

The nitrogen-containing aliphatic cyclic compound means a cyclic aliphatic compound containing a nitrogen atom, and examples thereof include pyrrolidine and piperidine.

The nitrogen-containing aromatic compound means an aromatic compound containing a nitrogen atom.

The nitrogen-containing aromatic compound may have a monocyclic structure or a polycyclic structure.

Examples of the nitrogen-containing aromatic compound include 1,2,3-triazole, benzotriazole, imidazole, and triazine.

As the nitrogen-containing aliphatic acyclic compound, a compound represented by Formula (1) is preferable from the viewpoint that the light-fast adhesiveness of the protective layer is more excellent.

Formula (1)

X represents a hydrophilic group selected from the group consisting of a hydroxyl group, a mercapto group, an amino group, and a phosphoric acid group. Among these, a hydroxyl group is preferable from the viewpoint that the light-fast adhesiveness of the protective layer is more excellent.

Y represents a hydrogen atom or a substituent other than the hydrophilic group. Examples of the substituent other than the hydrophilic group include an alkyl group, an aryl group, and a heteroaryl group.

L's each independently represent a single bond or a divalent linking group. The kind of the divalent linking group is not particularly limited, and examples thereof include a divalent saturated hydrocarbon group (which may be linear, branched, or cyclic, preferably has 1 to 20 carbon atoms, and includes, for example, an alkylene group), —O—, —S—, —$SO_2$—, —NR—, —CO—(—C(=O)—), —COO—(—C—(—C(=O)O—), —NR—CO—, —CO—NR—, —$SO_3$—, —$SO_2$NR—, and a group formed by combining these two groups. Here, R represents a hydrogen atom or an alkyl group (preferably having 1 to 10 carbon atoms).

n represents an integer of 1 to 3, and m represents an integer of 0 to 2, where a relationship of n+m=3 is satisfied. Among these, it is preferable that n is 3 and m is 0, from the viewpoint that the light-fast adhesiveness of the protective layer is more excellent.

The thickness of the nitrogen-containing compound layer is not particularly limited, and is preferably 1 nm or more from the viewpoint that the light-fast adhesiveness of the protective layer is more excellent. The upper limit value is not particularly limited and is often 100 nm or less.

The thickness of the nitrogen-containing compound layer corresponds to a thickness T3 from the surface of the nitrogen-containing compound layer 20 on the specific metal layer 18 side along the normal direction of the surface of the substrate 12 to the surface opposite to the specific metal layer 18 side as shown in FIG. 2.

<Protective Layer>

The protective layer is a layer arranged so as to cover the nitrogen-containing compound layer. It is preferable that the protective layer is also in contact with the substrate as shown in FIG. 2.

The material constituting the protective layer is not particularly limited, and preferably contains, for example, at least one hetero atom selected from the group consisting of a silicon atom, a sulfur atom, and a phosphorus atom.

More specifically, the protective layer preferably contains a resin, and examples of the resin include a siloxane-based resin, a (meth)acrylic resin, an epoxy-based resin, a urethane-based resin, a polyol-based resin, a polyvinyl-based resin, a polyolefin-based resin, and a polyester-based resin. From the viewpoint that a change in the surface state of the conductive film is further suppressed and the light-fast adhesiveness of the protective layer is more excellent, a siloxane-based resin is preferable.

The protective layer preferably contains a resin as a main component. The main component means that the content of the resin is 70% by mass or more with respect to the total mass of the protective layer. The upper limit value of the resin content is not particularly limited and may be 100% by mass with respect to the total mass of the protective layer.

As the protective layer, a transparent protective layer is preferable. The transparent protective layer means a protective layer having a transmittance of 60% or more for visible light (at a wavelength of 400 to 700 nm), and the transmittance is preferably 80% or more and more preferably 90% or more.

The thickness of the protective layer is not particularly limited, and is preferably 1 to 300 μm and more preferably 1 to 100 μm from the viewpoint that a change in the surface state of the conductive film is further suppressed and the transmittance of the conductive film is more excellent.

As shown in FIG. 2, the thickness of the protective layer corresponds to a thickness T4 from the surface of the protective layer 22 in contact with the substrate 12 along the normal direction of the surface of the substrate 12 to the surface on the opposite side of the substrate 12 side.

In FIGS. 1 and 2, various members are arranged on one surface of the substrate of the conductive film, but the present invention is not limited to this embodiment. The patterned layer to be plated, the copper plating layer, the specific metal layer, the nitrogen-containing compound layer, and the protective layer may be arranged on both surfaces of the substrate.

<Method of Producing Conductive Film>

A method of producing the conductive film is not particularly limited and a method including the following steps 1 to 7 is preferable.

Step 1: a step of bringing a substrate and a composition for forming a layer to be plated into contact with each other to form a to-be-plated layer precursor layer on the substrate Step 2: a step of performing an exposure treatment and a development treatment on the to-be-plated layer precursor layer to form a patterned layer to be plated Step 3: a step of applying a plating catalyst or a precursor thereof to the patterned layer to be plated Step 4: a step of performing a copper plating treatment on the patterned layer to be plated to which the plating catalyst or the precursor thereof is applied to form a copper plating layer Step 5: a step of forming a specific metal layer so as to cover the copper plating layer Step 6: a step of forming a nitrogen-containing compound layer so as to cover the specific metal layer Step 7: a step of forming a protective layer so as to cover the nitrogen-containing compound layer Hereinafter, the procedure of each step will be described in detail.

(Step 1)

Step 1 is a step of bringing a substrate and a composition for forming a layer to be plated into contact with each other to form a to-be-plated layer precursor layer on the substrate. By performing this step, a substrate with a to-be-plated layer precursor layer having the substrate and the to-be-plated layer precursor layer arranged on the substrate is obtained.

In addition, the to-be-plated layer precursor layer is a layer in an uncured state before being subjected to a curing treatment.

A method of bringing the substrate and the composition for forming a layer to be plated into contact with each other is not particularly limited, and for example, a method of applying the composition for forming a layer to be plated onto the substrate, or a method of immersing the substrate in the composition for forming a layer to be plated may be used.

As required, a drying treatment may be performed to remove the solvent from the to-be-plated layer precursor layer.

The composition for forming a layer to be plated contains the following compound X or composition Y.

Compound X: A compound having an interactive group and a polymerizable group Composition Y: A composition containing a compound having an interactive group, and a compound having a polymerizable group The compound X is a compound having an interactive group and a polymerizable group. The definition of the interactive group is as described above.

The compound X may have two or more of interactive groups.

The polymerizable group is a functional group capable of forming a chemical bond by energy application, and examples thereof include radically polymerizable group and a cationically polymerizable group. Among these, a radically polymerizable group is preferable in view of more excellent reactivity. Examples of the radically polymerizable group include an alkenyl group (for example, —C=C—), an unsaturated carboxylic acid ester group such as an acrylic acid ester group (acryloyloxy group), a methacrylic acid ester group (methacryloyloxy group), an itaconic acid ester group, a crotonic acid ester group, an isocrotonic acid ester group, or a maleic acid ester group, a styryl group, a vinyl group, an acrylamide group, and a methacrylamide group. Among these, an alkenyl group, a methacryloyloxy group, an acryloyloxy group, a vinyl group, a styryl group, an acrylamide group, or a methacrylamide group is preferable, and a methacryloyloxy group, an acryloyloxy group, or a styryl group is more preferable.

The compound X may have two or more polymerizable groups. In addition, the number of the polymerizable groups contained in the compound X is not particularly limited and may be one or two or more.

The compound X may be a low molecular weight compound or a polymer compound. The low molecular weight compound intends a compound having a molecular weight of less than 1000, and the polymer compound intends a compound having a molecular weight of 1000 or more.

In a case where the compound X is a polymer, the weight-average molecular weight of the polymer is not particularly limited and is preferably 1000 to 700,000 and more preferably 2000 to 200,000 from the viewpoint of more excellent handleability such as solubility.

A method of synthesizing the polymer having a polymerizable group and an interactive group is not particularly limited, and a known synthesis method (refer to paragraphs [0097] to [0125] of JP2009-280905A) is used.

The composition Y is a composition containing a compound having an interactive group and a compound having a polymerizable group. That is, the composition Y contains two kinds of compounds of a compound having an interactive group and a compound having a polymerizable group. The definitions of the interactive group and the polymerizable group are as described above.

The compound having an interactive group may be a low molecular weight compound or a polymer compound. The compound having an interactive group may contain a polymerizable group.

Preferable aspects of the compound having an interactive group include a polymer containing a repeating unit having an interactive group (for example, polyacrylic acid).

One preferable aspect of the repeating unit having an interactive group is a repeating unit represented by Formula (A).

Formula (A)

In Formula (A), $R^1$ represents a hydrogen atom or an alkyl group (for example, a methyl group, and an ethyl group).

$L^1$ represents a single bond or a divalent linking group. The kind of the divalent linking group is not particularly limited, and may be, for example, a divalent hydrocarbon group (the divalent hydrocarbon group may be a divalent saturated hydrocarbon group or a divalent aromatic hydrocarbon group. The divalent saturated hydrocarbon group may be linear, branched or cyclic and preferably has 1 to 20 carbon atoms, and examples thereof include an alkylene group. The divalent aromatic hydrocarbon group preferably has 5 to 20 carbon atoms, and examples thereof include a phenylene group. In addition to the above-mentioned groups, an alkenylene group or an alkynylene group may be used), and a divalent heterocyclic group, —O—, —S—, —SO$_2$—, —NR—, —CO—(—C(=O)—), —COO—(C—(=C(=O)O—), —NR—CO—, —CO—NR—, —SO$_3$—, —SO$_2$NR—, and a group obtained by combining two or more thereof may be adopted. Here, R represents a hydrogen atom or an alkyl group (preferably having 1 to 10 carbon atoms).

Z represents an interactive group. The definition of the interactive group is as described above.

Other preferable aspects of the repeating unit having an interactive group include a repeating unit derived from an unsaturated carboxylic acid or a derivative thereof.

The unsaturated carboxylic acid is an unsaturated compound having a carboxylic acid group (—COOH group). Examples of the derivative of the unsaturated carboxylic acid include anhydrides of unsaturated carboxylic acids, salts of unsaturated carboxylic acids, and monoesters of unsaturated carboxylic acids.

Examples of the unsaturated carboxylic acid include acrylic acid, methacrylic acid, crotonic acid, isocrotonic acid, maleic acid, fumaric acid, itaconic acid, and citraconic acid.

The content of the repeating unit having an interactive group in the polymer containing the repeating unit having the interactive group is not particularly limited, and from the viewpoint of a balance in plating precipitation properties, the content is preferably 1% to 100% by mole and more preferably 10% to 100% by mole with respect to all the repeating units.

As a preferable aspect of the polymer containing a repeating unit having an interactive group, a polymer X having a repeating unit derived from a conjugated diene compound and a repeating unit derived from an unsaturated carboxylic acid or a derivative thereof can be formed since a layer to be plated is easily formed with a small energy application amount (for example, an exposure amount) may be exemplified.

The description of the repeating unit derived from the unsaturated carboxylic acid or the derivative thereof is as described above.

The conjugated diene compound is not particularly limited as long as the compound is a compound having a molecular structure having two carbon-carbon double bonds separated by one single bond.

Examples of the conjugated diene compound include isoprene, 1,3-butadiene, 1,3-pentadiene, 2,4-hexadiene, 1,3-hexadiene, 1,3-heptadiene, 2,4-heptadiene, 1,3-octadiene, 2,4-octadiene, 3,5-octadiene, 1,3-nonadiene, 2,4-nonadiene, 3,5-nonadiene, 1,3-decadiene, 2,4-decadiene, 3,5-decadiene, 2,3-dimethyl-butadiene, 2-methyl-1,3-pentadiene, 3-methyl-1,3-pentadiene, 4-methyl-1,3-pentadiene, 2-phenyl-1,3-butadiene, 2-phenyl-1,3-pentadiene, 3-phenyl-1,3-pentadiene, 2,3-dimethyl-1,3-pentadiene, 4-methyl-1,3-pentadiene, 2-hexyl-1,3-butadiene, 3-methyl-1,3-hexadiene, 2-benzyl-1,3-butadiene, and 2-p-tolyl-1,3-butadiene.

Among these, it is preferable that the repeating unit derived from the conjugated diene compound is a repeating unit derived from the compound having the butadiene skeleton represented by Formula (2) from the viewpoint that the polymer X is easily synthesize and the properties of the layer to be plated are more excellent.

Formula (2)

In Formula (2), $R^2$'s each independently represent a hydrogen atom, a halogen atom or a hydrocarbon group. Examples of the hydrocarbon group include an aliphatic hydrocarbon group (for example, an alkyl group, an alkenyl group, or the like, preferably having 1 to 12 carbon atoms), and an aromatic hydrocarbon group (for example, a phenyl group, a naphthyl group, or the like). The plurality of $R^2$'s may be the same as or different from each other.

Examples of the compound having the butadiene skeleton represented by Formula (2) (a monomer having a butadiene structure) include 1,3-butadiene, isoprene, 2-ethyl-1,3-butadiene, 2-n-propyl-1,3-butadiene, 2,3-dimethyl-1,3-butadiene, 1-phenyl-1,3-butadiene, 1-α-naphthyl-1,3-butadiene, 1-β-naphthyl-1,3-butadiene, 2-chloro-1,3-butadiene, 1-bromo-1,3-butadiene, 1-chlorobutadiene, 2-fluoro-1,3-butadiene, 2,3-dichloro-1,3-butadiene, 1,1,2-trichloro-1,3-butadiene, and 2-cyano-1,3-butadiene.

The content of the repeating unit derived from the conjugated diene compound in the polymer X is preferably 25% to 75% by mole with respect to all the repeating units.

The content of the repeating unit derived from the unsaturated carboxylic acid or the derivative thereof in the polymer X is preferably 25% to 75% by mole with respect to all the repeating units.

The compound having a polymerizable group is a so-called monomer, and a polyfunctional monomer having two or more polymerizable groups is preferable from the viewpoint that the hardness of the formed patterned layer to be plated is more excellent. Specifically, the polyfunctional monomer is preferably a monomer having 2 to 6 polymerizable groups. The molecular weight of the polyfunctional monomer used is preferably 150 to 1000, and more preferably 200 to 800 from the viewpoint of the mobility of molecules during the crosslinking reaction that affects the reactivity.

As the polyfunctional monomer, an amide compound selected from the group consisting of a polyfunctional acrylamide having a polyoxyalkylene group and a polyfunctional methacrylamide having a polyoxyalkylene group is preferable.

The polyfunctional acrylamide contains two or more acrylamide groups. The number of acrylamide groups in the polyfunctional acrylamide is not particularly limited, and is preferably 2 to 10, more preferably 2 to 5, and even more preferably 2.

The polyfunctional methacrylamide contains two or more methacrylamide groups. The number of methacrylamide groups in the polyfunctional methacrylamide is not particularly limited, and is preferably 2 to 10, more preferably 2 to 5, and even more preferably 2.

The acrylamide group and the methacrylamide group are groups represented by Formula (B) and Formula (C), respectively. * represents a binding position.

Formula (B)

Formula (C)

$R^2$ represents a hydrogen atom or a substituent. The kind of the substituent is not particularly limited, and known substituents (for example, an aliphatic hydrocarbon group and an aromatic hydrocarbon group which may contain a hetero atom, more specifically, an alkyl group, an aryl group, and the like) may be used.

The polyoxyalkylene group is a group having an oxyalkylene group as a repeating unit. The polyoxyalkylene group is preferably a group represented by Formula (D).

Formula (D)

A represents an alkylene group. The number of carbon atoms in the alkylene group is not particularly limited, and is preferably 1 to 4 and more preferably 2 or 3. For example, in a case where A is an alkylene group having 1 carbon atom, -(A-O)— represents an oxymethylene group (—CH$_2$O—), in a case where A is an alkylene group having 2 carbon atoms, -(A-O)— represents an oxyethylene group (—CH$_2$CH$_2$O—), and in a case where A is an alkylene group having 3 carbon atoms, -(A-O)— represents an oxypropylene group (—CH$_2$CH(CH$_3$)O—, —CH(CH$_3$)CH$_2$O—, or —CH$_2$CH$_2$CH$_2$O—). The alkylene group may be linear or branched.

q represents the number of repeating oxyalkylene groups and represents an integer of 2 or more. The number of repetitions is not particularly limited, and is preferably 2 to 10 and more preferably 2 to 6.

The number of carbon atoms of the alkylene groups in the plurality of oxyalkylene groups may be the same as or different from each other.

In addition, in a case where a plurality of kinds of oxyalkylene groups are contained, the bonding order thereof is not particularly limited, and may be a random type or a block type.

The content of the compound X (or the composition Y) in the composition for forming a layer to be plated is not particularly limited, and is preferably 50% by mass or more and more preferably 80% by mass or more with respect to the total solid content in the composition for forming a layer to be plated. The upper limit value is 100% by mass.

In a case where the composition for forming a layer to be plated contains the composition Y, the content of the compound having an interactive group in the composition for forming a layer to be plated is not particularly limited, and is preferably 10% to 90% by mass, more preferably 25% to 75% by mass, and even more preferably 35% to 65% by mass with respect to the total solid content in the composition for forming a layer to be plated.

The mass ratio between the compound having an interactive group and the compound having a polymerizable group (the mass of the compound having an interactive group/the mass of the compound having a polymerizable group) is not particularly limited, and is preferably 0.1 to 10 and more preferably 0.5 to 2 from the viewpoint of a balance between the strength and plating suitability of the formed patterned layer to be plated.

The composition for forming a layer to be plated may contain components other than the above-mentioned components.

For example, the composition for forming a layer to be plated may contain a polymerization initiator. The kind of the polymerization initiator is not particularly limited, and a known polymerization initiator (preferably a photopolymerization initiator) may be used.

The composition for forming a layer to be plated may contain a solvent. The kind of the solvent is not particularly limited, and examples thereof include water and organic solvents. Examples of the organic solvents include known organic solvents (for example, an alcohol-based solvent, an ester-based solvent, a ketone-based solvent, a halogen-based solvent, and a hydrocarbon-based solvent).

The composition for forming a layer to be plated may contain other components (for example, a sensitizer, a curing agent, a polymerization inhibitor, an antioxidant, an antistatic agent, a filler, a flame retardant, a lubricant, a plasticizer, or a plating catalyst or a precursor thereof) as required.

(Step 2)

Step 2 is a step of performing an exposure treatment and a development treatment on the to-be-plated layer precursor layer to form a patterned layer to be plated.

In the exposure treatment, the to-be-plated layer precursor layer is irradiated with light in a pattern shape so as to obtain a desired patterned layer to be plated. The kind of light used is not particularly limited, and examples thereof include ultraviolet light and visible light. In a case of performing light irradiation in a pattern shape, it is preferable to perform light irradiation using a mask having an opening portion having a predetermined shape.

In the exposed portion of the to-be-plated layer precursor layer, the polymerizable group contained in the compound in the to-be-plated layer precursor layer is activated, crosslinking between the compounds occurs, and curing of the layer proceeds.

Next, by performing a development treatment on the to-be-plated layer precursor layer subjected to the curing treatment in the pattern shape, an unexposed portion is removed and thus a patterned layer to be plated is formed.

A method of the development treatment is not particularly limited, and the optimum development treatment is performed according to the kind of the material to be used. Examples of developers include organic solvents, pure water, and alkaline aqueous solutions.

(Step 3)

Step 3 is a step of applying a plating catalyst or a precursor thereof to the patterned layer to be plated.

Since the patterned layer to be plated has the above-described interactive group, the interactive group is attached to (adsorbs) the applied plating catalyst or precursor thereof according to the function thereof.

The plating catalyst or the precursor thereof functions as a catalyst or an electrode for the plating treatment. Therefore, the kind of the plating catalyst or the precursor thereof used is appropriately determined depending on the kind of plating treatment.

The plating catalyst or the precursor thereof is preferably an electroless plating catalyst or a precursor thereof.

The electroless plating catalyst is not particularly limited as long as the catalyst becomes an active nucleus during electroless plating, and examples thereof include metal having a catalytic ability for an autocatalytic reduction reaction (known as metal capable of electroless plating having a lower ionization tendency than Ni). Specific examples thereof include Pd, Ag, Cu, Pt, Au, and Co.

A metal colloid may be used as the electroless plating catalyst.

The electroless plating catalyst precursor is not particularly limited as long as the plating catalyst precursor becomes an electroless plating catalyst by a chemical reaction, and examples thereof include ions of the metals mentioned above as the electroless plating catalyst.

As a method of applying the plating catalyst or the precursor thereof to the patterned layer to be plated, for example, a solution in which the plating catalyst or the precursor thereof is dispersed or dissolved in a solvent is prepared, and the solution is applied onto the patterned layer to be plated, or the substrate with a patterned layer to be plated may be immersed in the solution.

Examples of the solvent include water and organic solvents.

(Step 4)

Step 4 is a step of performing a copper plating treatment on the patterned layer to be plated to which the plating catalyst or the precursor thereof is applied to form a copper plating layer.

A method of copper plating treatment is not particularly limited, and examples thereof include an electroless copper plating treatment and an electrolytic copper plating treatment (electro plating treatment). In this step, an electroless copper plating treatment may be performed alone, or an electrolytic copper plating treatment may be further performed after an electroless copper plating treatment is performed.

(Step 5)

Step 5 is a step of forming a specific metal layer so as to cover the copper plating layer.

Examples of the method of forming the specific metal layer include a lamination method and a substitution method, and a substitution method is preferable. Examples of the substitution method include a method of preparing a coating layer (specific metal layer) by substituting the copper plating layer surface with a nobler metal. Examples of the substitution plating method with a noble metal include a method using a solution containing ions of a metal that is electrochemically nobler than copper (for example, a solution containing palladium). In a case where a solution containing ions of a metal that is electrochemically nobler than copper is brought into contact with the copper plating layer, the copper constituting the layer is dissolved to form copper ions, and electrons are emitted. The electrons reduce the ions of the metal that is electrochemically nobler than copper in the solution, and the metal that is electrochemically nobler than copper is precipitated on the surface of the copper plating layer.

In a case of forming the specific metal layer, a method of bringing a predetermined solution into contact with the substrate having the copper plating layer obtained in the step 4 is preferable. Examples of the contact method include a method of applying a predetermined solution onto the substrate and a method of immersing the substrate in the predetermined solution.

The liquid temperature of the solution in the case of contact is not particularly limited and is usually 10° C. to 90° C., and preferably 20° C. to 60° C. The contact time is not particularly limited and is preferably 1 to 10 minutes.

(Step 6)

Step 6 is a step of forming a nitrogen-containing compound layer so as to cover the specific metal layer.

As a method of forming the nitrogen-containing compound layer, for example, a method of bringing a composition containing a nitrogen-containing compound into contact with the substrate having the specific metal layer obtained in the step 5 may be used. Examples of the contact method include a method of applying a composition containing a nitrogen-containing compound to the substrate and a method of immersing the substrate in a composition containing a nitrogen-containing compound.

The definition of the nitrogen-containing compound is as described above.

The concentration of the nitrogen-containing compound in the composition containing the nitrogen-containing compound is not particularly limited, and is preferably 0.1% to 20% by mass with respect to the total mass of the composition.

The composition containing the nitrogen-containing compound may contain components other than the nitrogen-containing compound. Other components include a solvent. Specific examples of the solvent include a solvent that may be contained in the composition for forming a layer to be plated described above.

The liquid temperature of the solution in the case of bringing the composition containing the nitrogen-containing compound into contact with the substrate having the specific metal layer obtained in the step 5 is not particularly limited and is usually 10° C. to 90° C. and preferably 20° C. to 60° C. The contact time is not particularly limited and is preferably 1 to 10 minutes.

After contacting the composition containing the nitrogen-containing compound with the substrate having the specific metal layer obtained in step 5, the substrate obtained may be washed as required.

(Step 7)

Step 7 is a step of forming a protective layer so as to cover the nitrogen-containing compound layer.

A method of forming the protective layer is not particularly limited, and the optimum method is selected according to the material to be used. For example, in a case of forming a protective layer containing a resin, a method of applying a composition containing a resin precursor (so-called a monomer) or a resin onto the substrate having the nitrogen-containing compound layer obtained in the step 6, and performing a curing treatment as required may be used.

Examples of the curing treatment method include a heat treatment.

(Other Procedures)

In a case where a conductive film is produced, the substrate with a patterned layer to be plated may be deformed into a substrate with a patterned layer to be plated having a three-dimensional shape. That is, by deforming the above-mentioned substrate with a patterned layer to be plated, a substrate with a layer to be plated having a substrate having a three-dimensional shape and a patterned layer to be plated arranged on the substrate is obtained. A conductive film having a three-dimensional shape can be produced by performing the steps 3 to 7 described above using the substrate with a patterned layer to be plated having a three-dimensional shape.

A method of deforming the substrate with a patterned layer to be plated is not particularly limited, and examples thereof include known methods such as vacuum forming, blow molding, free blow forming, pressure forming, vacuum-pressure forming, and heat press forming.

In addition, although the embodiment in which the substrate with a patterned layer to be plated is deformed has been described above, the present invention is not limited thereto. After the substrate with a to-be-plated layer precursor layer described above is deformed, the step 2 described above may be performed to obtain a substrate with a layer to be plated having a three-dimensional shape.

In addition, although the embodiment in which a curing treatment is performed on the to-be-plated layer precursor layer in a pattern shape to form a patterned layer to be plated has been described above, the present invention is not limited thereto. By arranging the to-be-plated layer precursor layer on the substrate in a pattern shape and performing a curing treatment on the patterned to-be-plated layer precursor layer, a patterned layer to be plated can be formed. In addition, as a method of arranging the to-be-plated layer precursor layer in a pattern shape, for example, a method of applying the composition for forming a layer to be plated to a predetermined position on the substrate by a screen printing method or an ink jet method may be used.

<Applications>

The conductive film according to the embodiment of the present invention can be used for various purposes. For example, the conductive film can be applied to various applications such as touch panel sensors, semiconductor chips, flexible printed circuits (FPC), chip on film (COF), tape automated bonding (TAB), antennae, multilayer wiring substrates, and mother boards. Among these, the conductive film is preferably used for a touch panel sensor (particularly, a capacitive touch sensor). In a case where the conductive film is applied to a touch panel sensor, the copper plating layer functions as a detection electrode or a lead wire in the touch panel sensor. Such a touch panel sensor can be suitably applied to a touch panel.

Further, the conductive film can also be used as a heating element. For example, by causing an electric current to flow in the copper plating layer, the temperature of the copper plating layer is increased and the copper plating layer functions as a heating wire.

EXAMPLES

Hereinafter, the present invention will be described in more detail based on examples. Materials, amounts used, proportions, treatment contents, treatment procedures, and the like provided in the following examples can be appropriately changed without departing from the gist of the present invention. Accordingly, the scope of the present invention should not be construed in a limited manner by the following examples.

Example 1

(Preparation of Composition for Forming to Layer to be Plated)

The following respective components were mixed to obtain a composition for forming a layer to be plated.

| | |
|---|---|
| Isopropanol | 36.6 parts by mass |
| 42% by mass aqueous solution of butadiene-maleic acid copolymer (manufactured by Polysciences, Inc.) | 2.38 parts by mass |
| Compound A: | 1 part by mass |
| IRGACURE 127 (manufactured by BASF SE) | 0.05 parts by mass |

Compound A (Preparation of Conductive Film)

AICAAITRON Z913-3 (manufactured by Aica Kogyo Company, Limited) was applied onto a resin support (polycarbonate (PC) film manufactured by Teijin Limited., PANLITE PC, thickness: 125 μm) to form a coating film. Next, the obtained coating film was irradiated with ultraviolet light to cure the coating film, and a primer layer having a thickness of 0.8 μm was formed. Thus, a substrate including a resin support and a primer layer was obtained.

Next, the composition for forming a layer to be plated was applied onto the obtained substrate to form a to-be-plated layer precursor layer having a thickness of 0.9 μm to obtain a substrate with a to-be-plated layer precursor layer.

Next, the to-be-plated layer precursor layer was exposed (0.2 J) through a quartz mask having a predetermined opening pattern so as to form a mesh-shaped layer to be plated having a thin line portion with a width of 1 μm and an opening portion with a side length of 150 μm. Thereafter, the exposed to-be-plated layer precursor layer was subjected to a shower development treatment to obtain a substrate having a mesh-shaped layer to be plated (a substrate with a layer to be plated) (refer to FIG. 1). The thickness of the mesh-shaped layer to be plated was 0.5 μm.

Next, the obtained substrate with a layer to be plated was immersed in a 1% by mass aqueous solution of sodium carbonate at room temperature for 5 minutes and was taken out. The substrate with a layer to be plated taken out was washed with pure water. Next, the substrate was immersed in a Pd catalyst application liquid (OMNI SHIELD 1573 activator, manufactured by Rohm and Haas Electronic Materials LLC.) at 30° C. for 5 minutes, and then was taken out. The substrate with a layer to be plated taken out was washed with pure water. Next, the obtained substrate with a layer to be plated was immersed in a reducing solution (CIRCUPOSIT PB oxide converter 60C, manufactured by Rohm and Haas Electronic Materials LLC.) at 30° C. for 5 minutes, and then was taken out. The substrate with a layer to be plated taken out was washed twice with pure water. Next, the obtained substrate with a layer to be plated was immersed in an electroless plating solution (CIRCUPOSIT 4500, manufactured by Rohm and Haas Electronic Materials LLC.) at 45° C. for 15 minutes, and then was taken out. The substrate with a layer to be plated taken out was washed with pure water to obtain a substrate having a mesh-shaped copper plating layer (a substrate with a copper plating layer). The copper plating layer was arranged so as to cover the mesh-shaped layer to be plated, and a part thereof was in contact with the substrate (refer to FIG. 2). The thickness of the copper plating layer was 3.0 μm.

Next, the obtained substrate with a copper plating layer and an OPC black copper solution (manufactured by Okuno Seiyaku Co., Ltd.) were brought into contact with each other at 30° C. for 3 minutes for treatment to form a specific metal layer covering the copper plating layer. Thus, a substrate with a specific metal layer was obtained (refer to FIG. 2). Palladium was contained in the specific metal layer. The thickness of the specific metal layer was 0.1 μm.

Next, the obtained substrate with a specific metal layer and a black keep solution containing ethanolamine (manufactured by Okuno Seiyaku Co., Ltd.) were brought into contact with each other at 30° C. for 1 minute to form a nitrogen-containing compound layer (ethanolamine-containing layer) covering the specific metal layer. Thus, a substrate with a nitrogen-containing compound layer was obtained (refer to FIG. 2).

Next, a solution of SilFORT PHC587C (manufactured by Momentive.com) diluted 4-fold with isopropanol was applied onto the substrate with a nitrogen-containing compound layer by spraying, and the obtained substrate was heated at 70° C. for 2 hours and then at 100° C. for 1 hour. Thus, a conductive film including a protective layer (siloxane-based resin-containing protective layer) covering the nitrogen-containing compound layer was obtained (refer to FIG. 2). The thickness of the protective layer was 3.0 μm.

Example 2

A substrate with a copper plating layer was obtained according to the same procedure as in Example 1.

Next, the obtained substrate with a copper plating layer and a blackening solution (OMNI SHIELD 1573 activator, manufactured by Rohm and Haas Electronic Materials LLC.) were brought into contact with each other at 25° C. for 1 minute and taken out, and the substrate taken out was washed twice with pure water to obtain a substrate with a specific metal layer including a specific metal layer arranged so as to cover the copper plating layer. Palladium was contained in the specific metal layer.

Next, the obtained substrate with a specific metal layer and an aqueous solution containing 1,2,3-triazole (concentration of 1,2,3-triazole: 1% by mass) were brought into contact with each other at 25° C. for 1 minute to form a nitrogen-containing compound layer (1,2,3-triazole-containing layer) covering the specific metal layer. Thus, a substrate with a nitrogen-containing compound layer.

Then, using the obtained substrate with a nitrogen-containing compound layer, a protective layer was formed according to the same procedure as in Example 1 to obtain a conductive film.

Comparative Example 1

A substrate with a copper plating layer was obtained according to the same procedure as in Example 1.

Next, a protective layer was formed using the obtained substrate with a copper plating layer according to the same procedure as in Example 1 to obtain a conductive film. The obtained conductive film does not include the specific metal layer and the nitrogen-containing compound layer.

<Evaluation>

(Surface State Evaluation)

The conductive films obtained in Examples and Comparative Examples were exposed for 500 hours under the conditions of 85° C. and 85 RH % using a constant-temperature constant-humidity tank IH401 manufactured by ESPEC Corp.

The conductive film after being exposed was observed with eyes or a microscope and evaluated according to the following standards.

A: Whitening and defects are not observed in the conductive film.

B: Although whitening or defects are observed in the conductive film, the whitening or defects are within a practically acceptable range, and the dissolution of the substrate and generation of through holes are not observed in the substrate.

C: Remarkable whitening or defects are observed in the conductive film, or the dissolution of the substrate or generation of through holes is observed in the substrate.

(Evaluation of Light-Fast Adhesiveness)

The conductive film obtained in each of Examples and Comparative Examples was continuously exposed at 240 W for 120 hours using a METALING WEATHER METER MV3000 manufactured by Suga Test Instruments Co., Ltd.

A piece of 18 mm wide cellophane tape (registered trademark: LP-18, manufactured by Nichiban Co., Ltd.) was attached onto the protective layer of the conductive film after exposure, and closely attached by friction with an eraser, and a one minute standby was performed. Thereafter, 90 degree peeling was performed, and evaluation was made according to the following standards.

A: The residual rate of the protective layer is 95% to 100%.

B: The residual rate of the protective layer is 90% or more and less than 95%.

C: The residual rate of the protective layer is less than 90%.

Table 1 collectively shows the evaluation results.

In Table 1, the column "Presence or absence of specific metal layer and nitrogen-containing compound layer" indicates the presence or absence of the specific metal layer and the nitrogen-containing compound layer in the conductive film, a case where the specific metal layer and the nitrogen-containing compound layer are included in the conductive film is shown as "Presence", and a case where the specific metal layer and the nitrogen-containing compound layer are not included in the conductive film is shown as "Absence".

TABLE 1

| | Presence or absence of specific metal layer and nitrogen-containing compound layer | Kind of nitrogen-containing compound | Evaluation of surface state | Evaluation of light-fast adhesiveness |
|---|---|---|---|---|
| Example 1 | Presence | Triethanolamine | A | A |
| Example 2 | Presence | 1,2,3-triazole | A | B |
| Comparative Example 1 | Absence | — | A | C |

As shown in Table 1 above, the desired effects were obtained in the conductive film according to the present invention. Particularly, the effects were more excellent in a case where a nitrogen-containing aliphatic acyclic compound was used.

Example 3

A substrate with a layer to be plated was obtained according to the same procedure as in Example 1.

Figure 3:
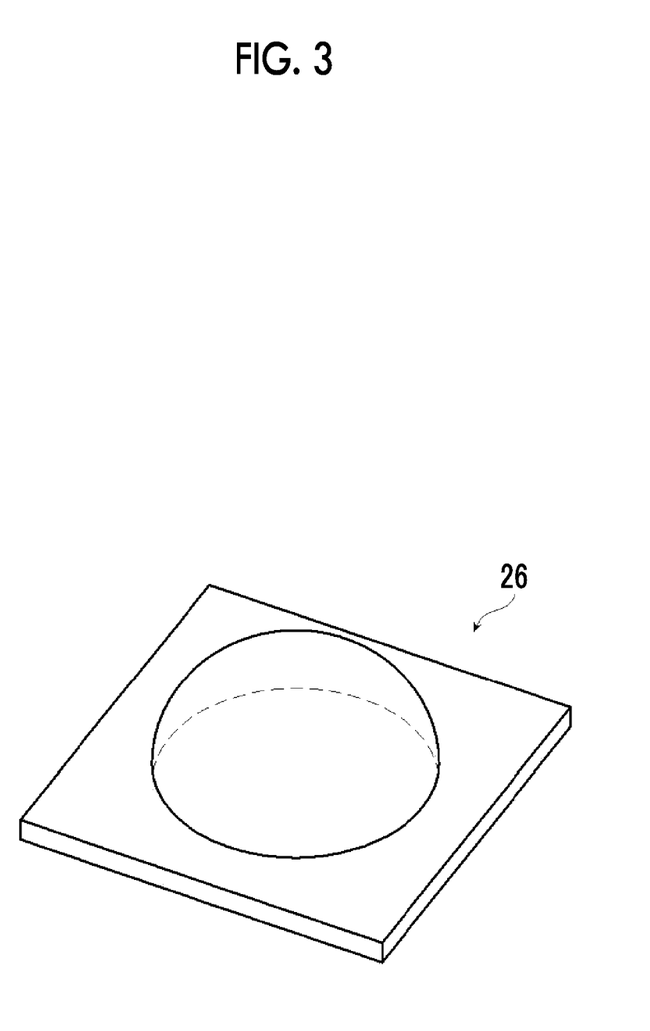
FIG. 3 is a perspective view of a substrate with a layer to be plated having a three-dimensional shape.

By deforming the center portion of the substrate with a layer to be plated into a hemispherical shape, a substrate 26 with a layer to be plated having a three-dimensional shape as shown in FIG. 3 was obtained.

Using the obtained substrate with a layer to be plated having a three-dimensional shape, a copper plating layer, a specific metal layer, a nitrogen-containing compound layer, and a protective layer were formed according to the same procedure as in Example 1 to obtain a conductive film having a three-dimensional shape.

EXPLANATION OF REFERENCES

10: conductive film
12: substrate
14: patterned layer to be plated
16: copper plating layer
18: specified metal layer
20: nitrogen-containing compound layer
22: protective layer
24: opening portion
26: substrate with layer to be plated

What is claimed is:

1. A conductive film comprising:
   a substrate;
   a patterned layer to be plated which is arranged on at least one surface of the substrate and has a functional group interacting with a plating catalyst or a precursor thereof;
   a copper plating layer which is arranged to cover the patterned layer to be plated and is in contact with the substrate;
   a metal layer which is arranged to cover the copper plating layer and contains a metal that is electrochemically nobler than copper;
   a nitrogen-containing compound layer which is arranged to cover the metal layer containing the metal that is electrochemically nobler than copper; and
   a protective layer which is arranged to cover the nitrogen-containing compound layer.

2. The conductive film according to claim 1, wherein the nitrogen-containing compound layer contains a nitrogen-containing non-aromatic compound or a nitrogen-containing aromatic compound.

3. The conductive film according to claim 2, wherein the nitrogen-containing compound layer contains the nitrogen-containing non-aromatic compound.

4. The conductive film according to claim 3, wherein the nitrogen-containing non-aromatic compound is a nitrogen-containing aliphatic acyclic compound.

5. The conductive film according to claim 4, wherein the nitrogen-containing aliphatic acyclic compound is a compound represented by Formula (1), Formula (1)

X represents a hydrophilic group selected from the group consisting of a hydroxyl group, a mercapto group, an amino group, and a phosphoric acid group, Y represents a hydrogen atom or a substituent other than the hydrophilic group, L's each independently represent a single bond or a divalent linking group, n represents an integer of 1 to 3, and m represents an integer of 0 to 2, where a relationship of n+m=3 is satisfied.

6. The conductive film according to claim 1, wherein the protective layer contains at least one hetero atom selected from the group consisting of a silicon atom, a sulfur atom, and a phosphorus atom.

7. The conductive film according to claim 1, wherein the protective layer contains a siloxane-based resin.

8. The conductive film according to claim 1, wherein the patterned layer to be plated is arranged in a mesh shape.

9. The conductive film according to claim 1, wherein the substrate has a three-dimensional shape.

10. A touch panel sensor comprising:
    the conductive film according to claim 1.

11. A touch panel comprising:
    the touch panel sensor according to claim 10.

12. The conductive film according to claim 2, wherein the protective layer contains at least one hetero atom selected from the group consisting of a silicon atom, a sulfur atom, and a phosphorus atom.

13. The conductive film according to claim 2, wherein the protective layer contains a siloxane-based resin.

14. The conductive film according to claim 2, wherein the patterned layer to be plated is arranged in a mesh shape.

15. The conductive film according to claim 2, wherein the substrate has a three-dimensional shape.

16. A touch panel sensor comprising:
    the conductive film according to claim 2.

17. A touch panel comprising:
    the touch panel sensor according to claim 16.

18. The conductive film according to claim 3, wherein the protective layer contains at least one hetero atom selected from the group consisting of a silicon atom, a sulfur atom, and a phosphorus atom.

19. The conductive film according to claim 3, wherein the protective layer contains a siloxane-based resin.

20. The conductive film according to claim 3, wherein the patterned layer to be plated is arranged in a mesh shape.

\* \* \* \* \*